United States Patent
Liu et al.

(10) Patent No.: US 9,379,497 B2
(45) Date of Patent: Jun. 28, 2016

(54) USB SSIC THIN CARD DEVICE AND DATA TRANSFER METHOD THEREOF

(71) Applicant: Industrial Technology Research Institute, Hsinchu (TW)

(72) Inventors: Chih-Yuan Liu, Hsinchu County (TW); Yuan-Heng Sun, New Taipei (TW); Chien-Hong Lin, Hsinchu County (TW); Jing-Shan Liang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 318 days.

(21) Appl. No.: 13/944,882

(22) Filed: Jul. 18, 2013

(65) Prior Publication Data

US 2014/0021802 A1 Jan. 23, 2014

Related U.S. Application Data

(60) Provisional application No. 61/673,709, filed on Jul. 19, 2012.

(30) Foreign Application Priority Data

Dec. 21, 2012 (TW) .............................. 101149161 A
Dec. 21, 2012 (TW) .............................. 101149176 A

(51) Int. Cl.
*H05K 7/10* (2006.01)
*H01R 13/66* (2006.01)
(Continued)

(52) U.S. Cl.
CPC ............ *H01R 13/665* (2013.01); *G06F 13/426* (2013.01); *H03K 17/002* (2013.01); *H05K 5/0278* (2013.01); *Y02B 60/1228* (2013.01); *Y02B 60/1235* (2013.01); *Y10T 307/858* (2015.04)

(58) Field of Classification Search
CPC . H01R 13/665; H03K 17/002; H05K 5/0278; G06F 13/426; Y10T 307/858; Y02B 60/1228; Y02B 60/1235
See application file for complete search history.

(56) References Cited

U.S. PATENT DOCUMENTS 7,171,502 B2 1/2007 Jeon et al.
7,543,080 B2 6/2009 Schade
(Continued)

FOREIGN PATENT DOCUMENTS

CN 102045112 5/2011
TW 200507602 2/2005
(Continued)

OTHER PUBLICATIONS

"MIPI Alliance Launches New M-PHY and UniPro Specifications for Mobile Device Applications, "MIPI Alliance, Jun. 10, 2011, pp. 1-2.
(Continued)

*Primary Examiner* — Jing-Yih Shyu
(74) *Attorney, Agent, or Firm* — Jianq Chyun IP Office

(57) ABSTRACT

A USB SSIC thin card device and a data transfer method thereof are provided. A first universal serial bus (USB) physical layer circuit is controlled by a USB device control unit to transmit data through a pair of first differential signal pins and a pair of a second differential signal pins, wherein the first USB physical layer circuit is used to transmit data complied with a USB 3.0 SSIC transmission specification.

6 Claims, 5 Drawing Sheets

(51) Int. Cl.
  *H03K 17/00*  (2006.01)
  *H05K 5/02*   (2006.01)
  *G06F 13/42*  (2006.01)

(56) References Cited

U.S. PATENT DOCUMENTS

| | | | |
|---|---|---|---|
| 7,606,947 B2 | 10/2009 | Lin et al. | |
| 8,140,900 B2 | 3/2012 | Yang et al. | |
| 8,234,416 B2* | 7/2012 | Lai | G06F 13/4081 710/100 |
| 8,270,840 B2* | 9/2012 | Lai | G06F 13/385 398/135 |
| 8,457,247 B2* | 6/2013 | Fountain | H04L 25/4908 375/271 |
| 2006/0047982 A1* | 3/2006 | Lo | G11C 5/143 713/300 |
| 2007/0033307 A1* | 2/2007 | Yu | G06K 19/07732 710/62 |
| 2008/0010406 A1* | 1/2008 | Kang | G06F 13/387 711/115 |
| 2010/0275037 A1 | 10/2010 | Lee et al. | |
| 2010/0281187 A1 | 11/2010 | Kim et al. | |
| 2011/0043162 A1 | 2/2011 | Lee et al. | |
| 2011/0126066 A1 | 5/2011 | Jo et al. | |
| 2011/0145556 A1 | 6/2011 | Hakoun et al. | |
| 2012/0017016 A1* | 1/2012 | Ma | G06F 13/426 710/110 |
| 2012/0059965 A1* | 3/2012 | Foster | G06F 1/12 710/305 |
| 2012/0096286 A1* | 4/2012 | Huang | G06F 1/263 713/300 |
| 2012/0159008 A1* | 6/2012 | Park | G06F 13/387 710/15 |
| 2012/0210143 A1* | 8/2012 | Amemura | G06F 1/266 713/300 |
| 2012/0290761 A1* | 11/2012 | Chen | G06F 13/42 710/305 |
| 2013/0129283 A1* | 5/2013 | Lee | H01R 13/665 385/71 |
| 2013/0262731 A1* | 10/2013 | Ranganathan | G06F 13/426 710/305 |

FOREIGN PATENT DOCUMENTS

| | | |
|---|---|---|
| TW | 200606952 | 2/2006 |
| TW | 200825699 | 6/2008 |
| TW | M404998 | 6/2011 |
| TW | 201135473 | 10/2011 |
| TW | 201216070 | 4/2012 |

OTHER PUBLICATIONS

Ashraf Takla, "M-PHY benefits and challenges, " EE Times Design, Apr. 11, 2011, pp. 1-9.

Harshal Chhaya et al., "Verification approach towards an evolving IP," Cybermedia India Online Ltd, Mar. 25, 2013, pp. 1-6.

"Office Action of Taiwan Counterpart Application", issued on Aug. 11, 2014, p. 1-p. 6.

"Office Action of Taiwan Counterpart Application", issued on Sep. 1, 2014, p. 1-p. 11.

"Office Action of China Counterpart Application", issued on Nov. 3, 2015, p. 1-p. 3.

* cited by examiner

USB SSIC THIN CARD DEVICE AND DATA TRANSFER METHOD THEREOF

CROSS-REFERENCE TO RELATED APPLICATION

This application claims the priority benefits of U.S. provisional application Ser. No. 61/673,709, filed on Jul. 19, 2012. This application also claims the priority benefits of Taiwan application serial no. 101149176, filed on Dec. 21, 2012, and Taiwan application serial no. 101149161, filed on Dec. 21, 2012. The entirety of each of the above-mentioned patent applications is hereby incorporated by reference herein and made a part of this specification.

BACKGROUND

1. Technical Field

The disclosure relates to a USB SSIC (SuperSpeed USB Inter-Chip) thin card device and a data transfer method thereof. Particularly, the disclosure relates to a USB SSIC thin card device complying with a universal serial bus (USB) 3.0 SSIC transmission specification and a data transfer method thereof.

2. Related Art

Along with development of technology, various external universal serial bus (USB) devices are quickly developed in the market, which not only bring convenience to the lives of people, but also play an indispensable role in people's daily life, for example, a smart phone, a tablet PC or an eBook, etc. Since mobile devices are all developed in a trend of "lightness, slimness, shortness and smallness" and "high-performance and low power consumption", demands for memory cards having features of small size, fast speed and low power consumption are greatly increased. Presently, the SD-series memory cards are widely used on the mobile devices. Although the USB 3.0 has high-speed and diversified complete peripherals, it is not optimised in power consumption for the mobile devices, and a power consumption specification thereof is not complied with a demand of low power consumption of the mobile devices, so that it fails to enter the mobile device market.

SUMMARY

The disclosure is directed to a USB SSIC thin card device and a data transfer method thereof, where the USB SSIC thin card device satisfies a low power consumption demand of mobile device and has high-speed data transmission quality.

The disclosure provides a USB SSIC thin card device, which is adapted to be connected to a host device for data transmission. The USB SSIC thin card device includes a first universal serial bus (USB) physical layer circuit, a pair of first differential signal pins, a pair of second differential signal pins, a USB device control unit, a plate body, a first ground pin and a second pin row, where the first USB physical layer circuit is used to transmit data complied with a USB 3.0 SSIC transmission specification. The USB device control unit controls the first USB physical layer circuit to perform data transmission through the pair of first differential signal pins and the pair of second differential signal pins. The pair of first differential signal pins, the pair of second differential signal pins and the first ground pin form a first pin row, and the first ground pin is located between the pair of first differential signal pins and the pair of second differential signal pins. The first pin row and the second pin row are parallel to a side edge of the plate body and are disposed on the plate body, and the second pin row is closer to the side edge compared to the first pin row. The second pin row comprises a pair of third differential signal pins, a first power pin and a second ground pin, wherein the pair of third differential signal pins is located between the first power pin and the second ground pin.

The disclosure also provides a data transfer method of a USB SSIC thin card device, which is adapted to perform data transmission with a host device, where the USB SSIC thin card device includes a first universal serial bus (USB) physical layer circuit, a second USB physical layer circuit and a third USB physical layer circuit. The data transfer method includes following steps. A power voltage supplied to the USB SSIC thin card device is detected. It is determined whether the power voltage is smaller than a predetermined voltage. If the power voltage is smaller than the predetermined voltage, the first USB physical layer circuit is selected to perform data transmission with the host device through a pair of first differential signal pins and a pair of second differential signal pins, where the first USB physical layer circuit is used to transmit data complied with a USB 3.0 SSIC transmission specification. If the power voltage is not smaller than the predetermined voltage, it is determined whether the pair of first differential signal pins and the pair of second differential signal pins have signal transmission. If the pair of first differential signal pins and the pair of second differential signal pins have the signal transmission, the second USB physical layer circuit is selected to perform data transmission with the host device through the pair of first differential signal pins and the pair of second differential signal pins. If the pair of first differential signal pins and the pair of second differential signal pins do not have the signal transmission, the third USB physical layer circuit performs data transmission with the host device through a pair of third differential signal pins.

According to the above descriptions, in the disclosure, the USB physical layer circuits and the pairs of differential signal pins used for transmitting data complied with the USB 3.0 SSIC transmission specification are configured in the USB SSIC thin card device, such that the power consumption of the USB SSIC thin card device complies with the standard of mobile device, so as to satisfy the requirement of using in the mobile device such as a mobile phone, etc. Moreover, by using an interface specification detection unit to select the USB physical layer circuit used for transmitting data according to the power voltage, the USB SSIC thin card device is complied with the host device of different USB transmission specifications, which improves usage convenience of the USB SSIC thin card device.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
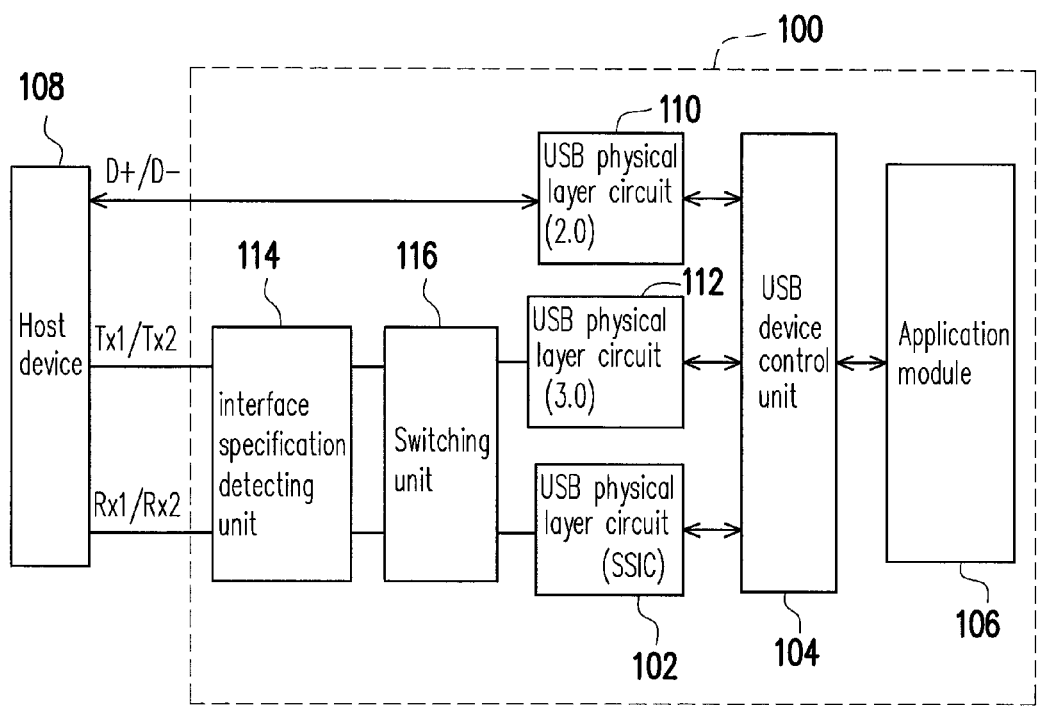
FIG. 1 is a schematic diagram of a USB SSIC thin card device according to an embodiment of the disclosure.

FIG. 1 is a schematic diagram of a USB SSIC thin card device according to an embodiment of the disclosure. Referring to FIG. 1, the USB SSIC thin card device 100 can be connected to a host device 108 to perform data transmission with the host device 108. The USB SSIC thin card device 100 includes a universal serial bus (USB) physical layer circuit 102, a USB device control unit 104, an application module 106, a USB physical layer circuit 110, a USB physical layer circuit 112, an interface specification detecting unit 114 and a switching unit 116, where the application module 106 may serve as a memory or an input/output (I/O) interface, the USB physical layer circuit 102 is used to transmit data complied with USB 3.0 SSIC transmission specification. The USB device control unit 104 is coupled to the USB physical layer circuit 102, the USB physical layer circuit 110, the USB physical layer circuit 112 and the application module 106. The USB device control unit 104 controls the USB physical layer circuit 102 to perform data transmission through a pair of first differential signal pins Tx1 and Tx2 and a pair of second differential signal pins Rx1 and Rx2, controls the USB physical layer circuit 110 to transmit data complied with a USB 2.0 transmission specification, and controls the USB physical layer circuit 112 to transmit data complied with the USB 3.0 transmission specification. The switching unit 116 is coupled to the USB physical layer circuit 102, the USB physical layer circuit 112 and the interface specification detecting unit 114, wherein the interface specification detecting unit 114 is further coupled to the host device 108. The interface specification detecting unit 114 is used to detect a transmission specification corresponding to the host device 108 connected to the USB SSIC thin card device 100. The switching unit 116 determines whether to select the USB physical layer circuit 102 or the USB physical layer circuit 112 to perform the data transmission according to a power voltage supplied to the USB SSIC thin card device 100. Namely, the switching unit 116 can select the USB physical layer circuit 102 or 112 to perform data transmission according to specification of a transmission port of the host device 108, where the power voltage supplied to the USB SSIC thin card device 100 can be detected by the interface specification detecting unit 114, and data transmission is controlled by the USB device control unit 104. In the present embodiment, the USB physical layer circuit 102 and 112 perform data transmission through the pair of first differential signal pins Tx1 and Tx2 and the pair of second differential signal pins Rx1 and Rx2, and the USB physical layer circuit 110 performs data transmission through a pair of third differential signal pins D+ and D−.

In detail, the interface specification detecting unit 114 can determine whether the power voltage is smaller than a predetermined voltage (for example, 3V, but not limited thereto). If the power voltage is smaller than the predetermined voltage, it represents that the data transmission specification of the host device 108 uses the USB 3.0 SSIC transmission specification, and meanwhile, the switching unit 116 selects the USB physical layer circuit 102 to perform the data transmission with the host device 108 through the pair of first differential signal pins Tx1 and Tx2 and the pair of second differential signal pins Rx1 and Rx2. If the power voltage is not smaller than the predetermined voltage, it represents that the data transmission specification of the host device 108 can be the USB 3.0 or USB 2.0. The interface specification detecting unit 114 first determines whether the pair of first differential signal pins Tx1 and Tx2 and the pair of second differential signal pins Rx1 and Rx2 have a signal transmission, and if the pair of first differential signal pins Tx1 and Tx2 and the pair of second differential signal pins Rx1 and Rx2 have the signal transmission, it represents that the data transmission specification of the host device 108 uses the USB 3.0 specification, and the switching unit 116 selects the USB physical layer circuit 112 to perform the data transmission with the host device 108 through the pair of first differential signal pins Tx1 and Tx2 and the pair of second differential signal pins Rx1 and Rx2. If the pair of first differential signal pins Tx1 and Tx2 and the pair of second differential signal pins Rx1 and Rx2 do not have the signal transmission, it represents that the data transmission specification of the host device 108 uses the USB 2.0 specification.

As described above, the interface specification detecting unit 114 selects the suitable USB physical layer circuit for transmitting data according to the power voltage received by the USB SSIC thin card device 100, which is not only compatible to the USB 3.0 SSIC transmission specification, but is also backward compatible to the USB 3.0 and USB 2.0 transmission specifications. By providing a corresponding transmission mode to the host device 108 of different transmission specifications, usage convenience of the USB SSIC thin card device 100 is greatly improved.

Since the USB physical layer circuit 102 uses a USB 3.0 high-speed communication protocol and a software mode and a mobile industry processor interface (MIPI) low power consumption physical layer technique, the USB physical layer circuit 102 has characteristics of high transmission speed and low power consumption, and can be directly applied in mobile devices (such as mobile phones, tablet PCs, and cameras, etc.), which improves flexibility and universality of the interfaces of the mobile devices, and developers are unnecessary to repeatedly develop all of the interfaces and peripheral devices, and ranges of suitable application processor systems and peripheral devices are significantly extended.

Figure 2:
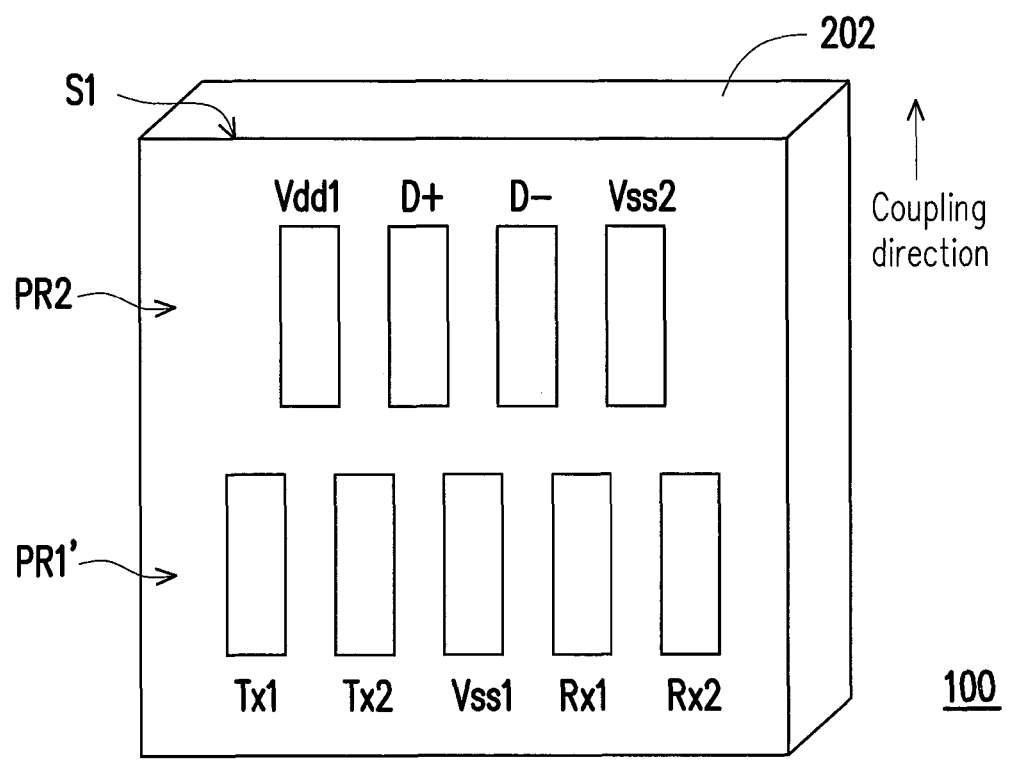
FIG. 2 is schematic diagram of configurations of signal pins of a USB SSIC thin card device according to an embodiment of the disclosure.

Further, configuration of signal pins of the USB SSIC thin card device 100 can be as that shown in FIG. 2, and the USB SSIC thin card device 100 includes a plate body 202. A pin row PR1' and a pin row PR2 are configured/disposed on the plate body 202, where the pin row PR1' is a data transmission/reception pin row supporting the USB 3.0 and the USB 3.0 SSIC transmission specifications, and the pin row PR2 is a data transmission/reception pin row supporting the USB 2.0 transmission specification. The pin row PR1' and the pin row PR2 are configured/disposed on the plate body 202, and are parallel to a side edge S1 of the plate body 202, where the pin row PR2 is closer to the side edge S1 compared to the pin row PR1', and the side edge S1 is perpendicular to a coupling direction of the USB SSIC thin card device 100 and the host device 108. The pin row PR1' includes the pair of first differential signal pins Tx1 and Tx2, the pair of second differential signal pins Rx1 and Rx2 and the ground pin Vss1, where the ground pin Vss1 is located between the pair of first differential signal pins Tx1 and Tx2 and the pair of second differential signal pins Rx1 and Rx2. The pin row PR2 includes the pair of third differential signal pins D+ and D−, the power pin Vdd1 and the ground pin Vss2, where the pair of third differential signal pins D+ and D− is located between the power pin Vdd1 and the ground pin Vss2.

The USB physical layer circuit 110 can perform the data transmission with the host device 108 through the pair of third differential signal pins D+ and D−, and the USB physical layer circuit 102 and the USB physical layer circuit 112 can perform the data transmission with the host device 108 through the pair of first differential signal pins Tx1 and Tx2 and the pair of second differential signal pins Rx1 and Rx2. As described above, since the USB SSIC thin card device 100 has the characteristic of low power consumption, it can be applied on the mobile devices, and all of the pins are designed into a pad type of the present embodiment, such that the USB SSIC thin card device 100 can serve as an embedded memory card of the mobile devices.

Figure 3:
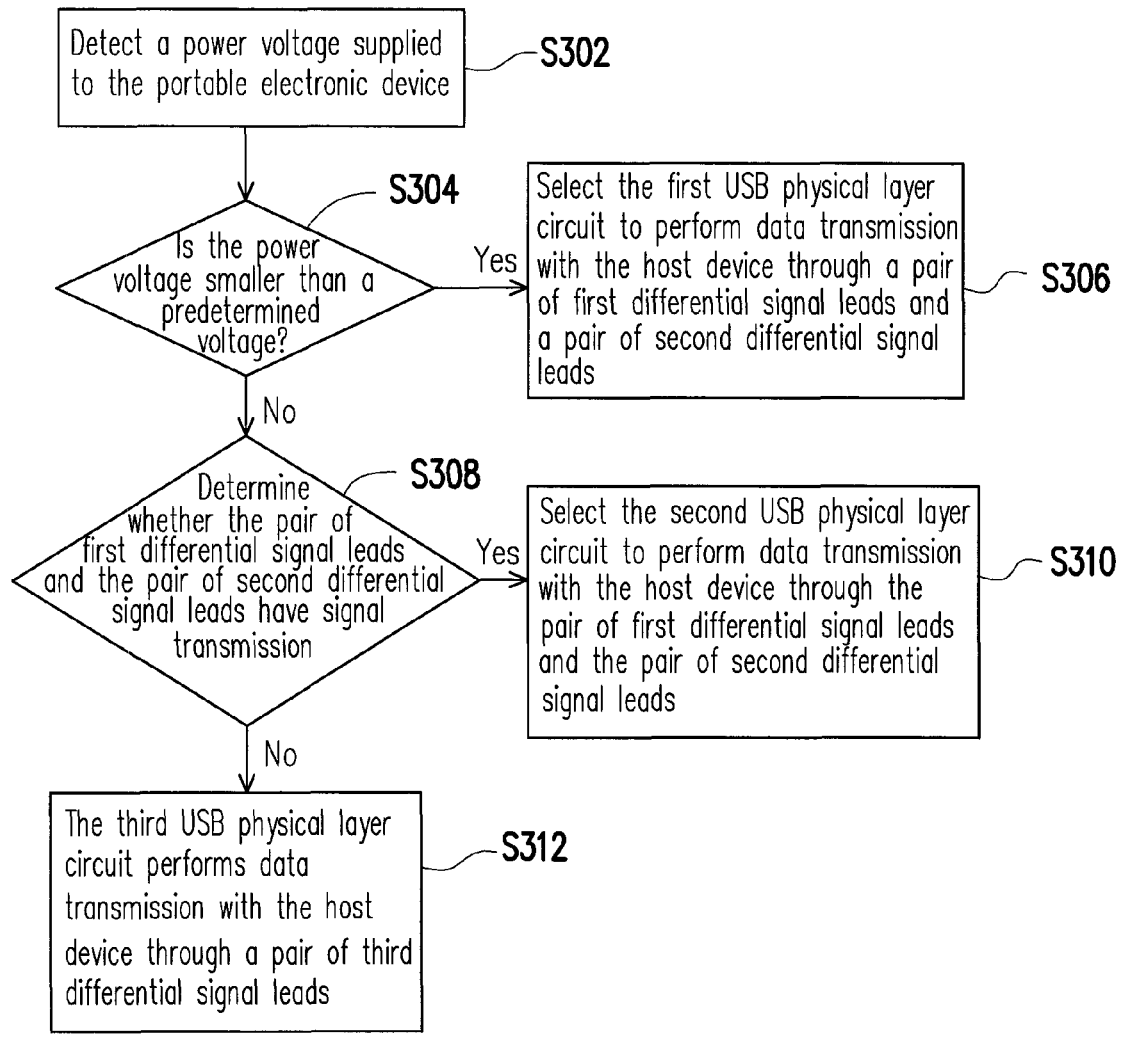
FIG. 3 is a flowchart illustrating a data transfer method of a USB SSIC thin card device according to an embodiment of the disclosure.

FIG. 3 is a flowchart illustrating a data transfer method of a USB SSIC thin card device according to an embodiment of the disclosure. Referring to FIG. 3, the data transfer method of the USB SSIC thin card device may include following steps. First, a power voltage supplied to the USB SSIC thin card device is detected (step S302). Then, it is determined whether the power voltage is smaller than a predetermined voltage (step S304), wherein the predetermined voltage is, for example, 3V (but not limited thereto), and if the power voltage is smaller than the predetermined voltage, it represents that the transmission interface of the host device is complied with the USB 3.0 SSIC transmission specification. If the power voltage is smaller than the predetermined voltage, the first USB physical layer circuit is selected to perform data transmission with the host device through a pair of first differential signal pins and a pair of second differential signal pins (step S306), where the first USB physical layer circuit is used to transmit data complied with the USB 3.0 SSIC transmission specification. If the power voltage is not smaller than the predetermined voltage, it is determined whether the pair of first differential signal pins and the pair of second differential signal pins have signal transmission (step S308). If the pair of first differential signal pins and the pair of second differential signal pins have the signal transmission, the second USB physical layer circuit is selected to perform data transmission with the host device through the pair of first differential signal pins and the pair of second differential signal pins (step S310), where the second USB physical layer circuit is, for example, used to transmit data complied with the USB 3.0 transmission specification. If the pair of first differential signal pins and the pair of second differential signal pins do not have the signal transmission, the third USB physical layer circuit performs data transmission with the host device through a pair of third differential signal pins (step S312), where the third USB physical layer circuit is, for example used to transmit data complied with the USB 2.0 transmission specification.

Figure 4:
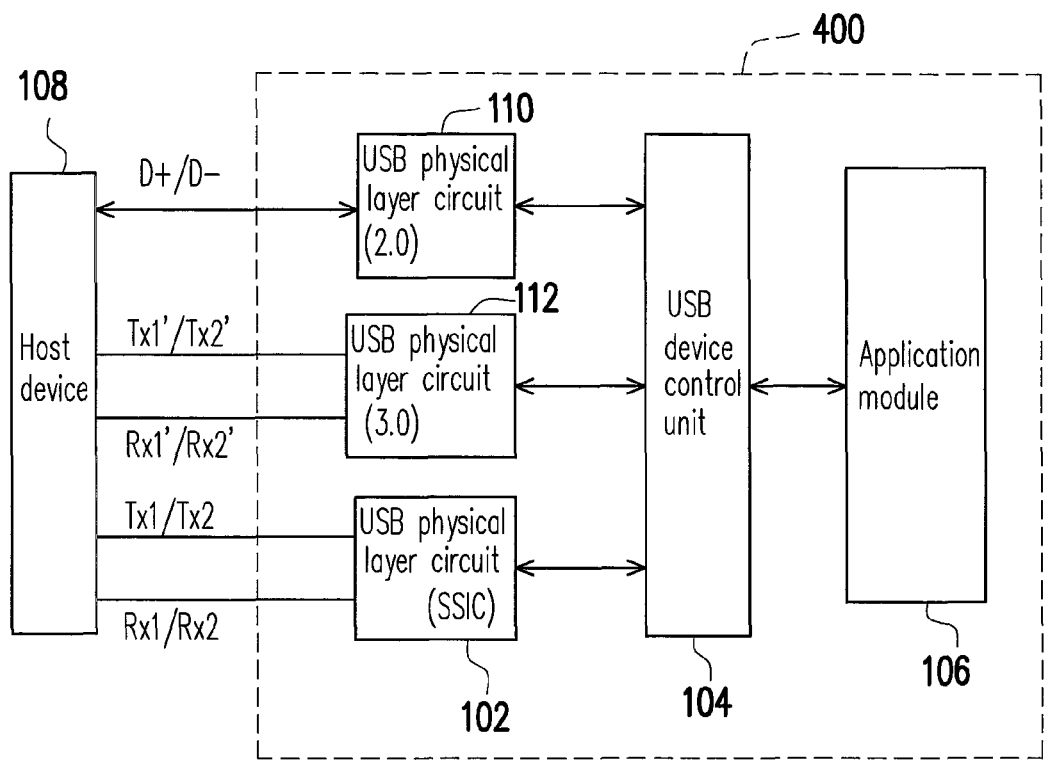
FIG. 4 is a schematic diagram of a USB SSIC thin card device according to another embodiment of the disclosure.

FIG. 4 is a schematic diagram of a USB SSIC thin card device according to another embodiment of the disclosure. Referring to FIG. 4, compared to the USB SSIC thin card device 100, the USB SSIC thin card device 400 of the present embodiment does not include the interface specification detecting unit 114 and the switching unit 116, the USB physical layer circuit 102 and the USB physical layer circuit 112 are directly coupled to the host device 108, where operation methods of the USB physical layer circuit 102, 110, 112, the USB device control unit 104 and the application module 106 are the similar to the description of FIG. 1, thus the detail is not iterated. Since the USB SSIC thin card device 400 of the present embodiment does not include the interface specification detecting unit 114 and the switching unit 116, configuration of the signal pins of the card device 400 is different from that of FIG. 2.

Figure 5:
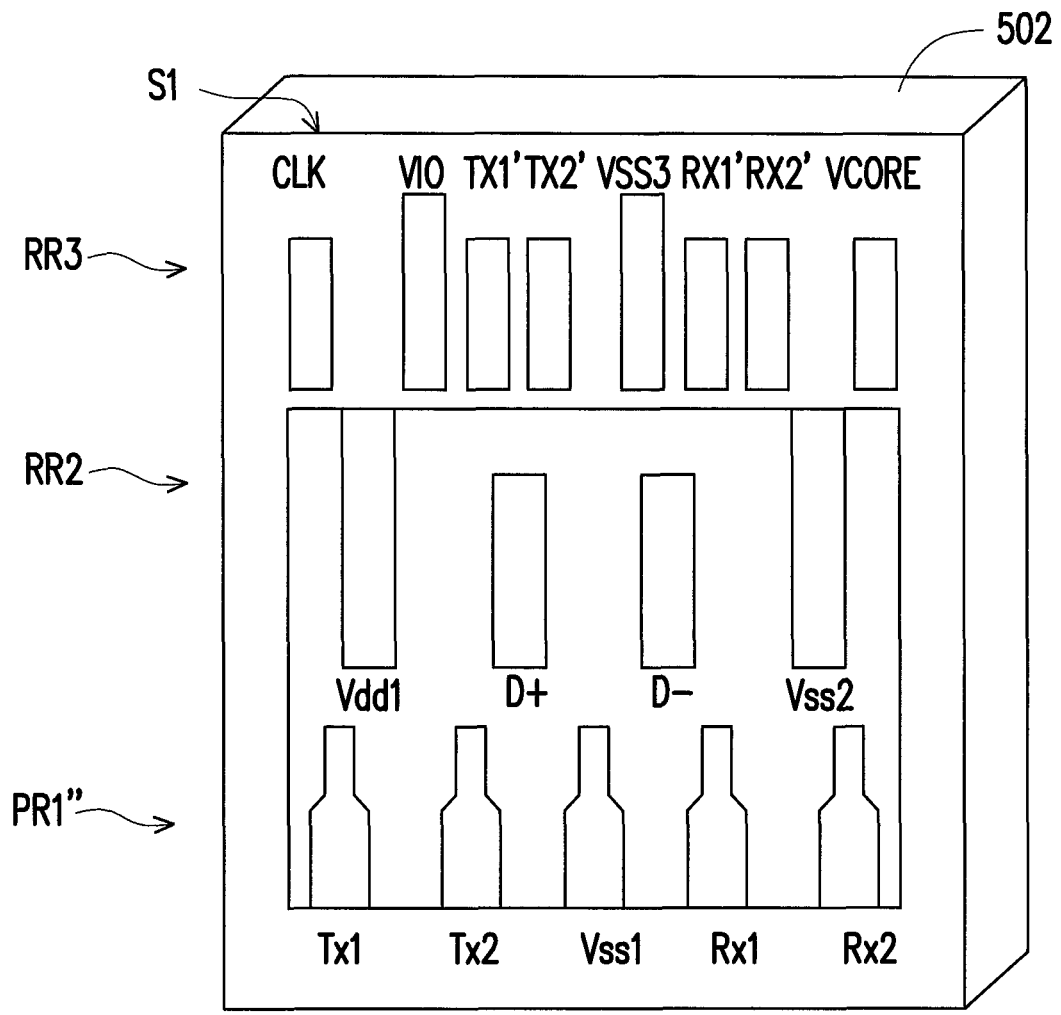
FIG. 5 is a schematic diagram of a configuration of signal pins of a USB SSIC thin card device according to another embodiment of the disclosure.

FIG. 5 is a schematic diagram of a configuration of signal pins of a USB SSIC thin card device according to another embodiment of the disclosure. Referring to FIG. 5, The USB SSIC thin card device 400 includes a plate body 502. A pin row PR1", the pin row PR2 and a pin row PR3 are configured on the plate body 502, where the pin row PR1" is a data transmission/reception pin row supporting the USB 3.0 SSIC transmission specifications, the pin row PR2 is a data transmission/reception pin row supporting the USB 2.0 transmission specification, and the pin row PR3 is a data transmission/reception pin row supporting the USB 3.0 transmission specification.

The pin row PR1", the pin row PR2 and the pin row PR3 are configured/disposed on the plate body 502, and are parallel to a side edge S1 of the plate body 502, where a sequence of distances from far to near between the pin row PR1", the pin row PR2 and the pin row PR3 and the side edge S1 is the pin row PR1", the pin row PR2 and the pin row PR3, i.e. the pin row PR3 is the closest to the side edge S1, and the pin row PR1" is the farthest from the side edge S1. The pin row PR3 also can be alone configured/disposed on the plate body 502 without PR1 and PR2 as well.

The pin row PR1" includes the pair of first differential signal pins Tx1 and Tx2, the pair of second differential signal pins Rx1 and Rx2 and ground pin Vss1, where the ground pin Vss1 is located between the pair of first differential signal pins Tx1 and Tx2 and the pair of second differential signal pins Rx1 and Rx2. The pin row PR2 includes the pair of third differential signal pins D+ and D−, the power pin Vdd1 and the ground pin Vss2, where the pair of third differential signal pins D+ and D− is located between the power pin Vdd1 and the ground pin Vss2. The pin row PR3 includes a pair of fourth differential signal pins Tx1' and Tx2', a pair of fifth differential signal pins Rx1' and Rx2', a ground pin Vss3, an input/output voltage pin VIO, a clock signal pin CLK and a core voltage pin VCORE, where the pair of fourth differential signal pins Tx1' and Tx2' is located between the ground pin Vss3 and the input/output voltage pin VIO, the pair of fifth differential signal pins Rx1' and Rx2' is located between the ground pin Vss3 and the core voltage pin VCORE, the ground pin Vss3 is located between the pair of fourth differential signal pins Tx1' and Tx2' and the pair of fifth differential signal pins Rx1' and Rx2', and the clock signal pin CLK and the core voltage pin VCORE are respectively located at an outermost position of the pin row PR3.

In the present embodiment, the USB physical layer circuit 102 can perform the data transmission with the host device 108 through the pair of first differential signal pins Tx1 and Tx2 and the pair of second differential signal pins Rx1 and Rx2, the USB physical layer circuit 110 can perform the data transmission with the host device 108 through the pair of third differential signal pins D+ and D−, and the USB physical layer circuit 112 can perform the data transmission with the host device 108 through the pair of fourth differential signal pins Tx1' and Tx2' and the pair of fifth differential signal pins Rx1' and Rx2'.

Similarly, since the aforementioned USB SSIC thin card devices 400 has the USB 3.0 SSIC transmission interface, and has the characteristic of low power consumption, and all of the pins are designed into the pad type, the aforementioned USB SSIC thin card devices 400 can serve as embedded memory or I/O (WIFI, GPS, NFC, RFID) cards of the mobile devices.

In summary, the USB physical layer circuits and the pairs of differential signal pins used for transmitting data complied with the USB 3.0 SSIC transmission specification are configured in the USB SSIC thin card device, such that the power consumption of the USB SSIC thin card device complies with the standard of mobile device, so as to satisfy the requirement of using in the mobile device such as a mobile phone, etc., and improve flexibility and universality of the interfaces of the mobile devices, such that developers are unnecessary to repeatedly develop all of the interfaces and peripheral devices, which significantly extends ranges of suitable application processor systems and peripheral devices. Moreover, by using the interface specification detection unit to select the USB physical layer circuit used for transmitting data according to the power voltage, the USB SSIC thin card device is complied with the host device of different USB transmission specifications, which improves usage convenience of the USB SSIC thin card device.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A USB SSIC (SuperSpeed USB Inter-Chip) thin card device, configured to connect to a host device for data transmission, and the USB SSIC thin card device comprising:
    a USB (universal serial bus) SSIC circuit, configured to transmit data complied with a USB 3.0 SSIC transmission specification;
    a pair of first differential signal pins;
    a pair of second differential signal pins;
    a pair of third differential signal pins;
    a USB device control unit, configured to control the USB SSIC circuit to perform data transmission;
    wherein the USB SSIC circuit performs data transmission through the pair of first differential signal pins and the pair of second differential signal pins; and
    a second USB physical layer circuit, coupled to the host device, and configured to transmit data complied with a USB 3.0 transmission specification;
    a third USB physical layer circuit, coupled to the host device, and configured to transmit data complied with a USB 2.0 transmission specification, wherein the USB device control unit controls the third USB physical layer circuit to perform data transmission;
    a switching unit, coupled to the USB SSIC circuit and the second USB physical layer circuit, and configured to select the circuit for transmitting data according to a power voltage,
    an interface specification detecting unit, coupled to the switching unit and the host device, configured to detect a transmission specification corresponding to the host device, and configured to select a USB physical layer circuit for transmitting data according to the transmission specification corresponding to the host device;
    wherein the interface specification detecting unit further determines whether the power voltage is smaller than a predetermined voltage;
    wherein when the power voltage is smaller than the predetermined voltage, the switching unit selects the USB SSIC circuit to transmit data with the host device;
    wherein when the power voltage is not smaller than the predetermined voltage, the interface specification detecting unit determines whether the pair of first differential signal pins and the pair of second differential signal pins have signal transmission,
    wherein when the pair of first differential signal pins and the pair of second differential signal pins have the signal transmission, the switching unit selects the second USB physical layer circuit to perform data transmission with the host device through the pair of first differential signal pins and the pair of second differential signal pins,
    wherein when the pair of first differential signal pins and the pair of second differential signal pins do not have the signal transmission, the third USB physical layer circuit to perform data transmission with the host device through the pair of third differential signal pins.

2. The USB SSIC thin card device as claimed in claim 1, wherein the USB SSIC thin card device further comprises:
    a plate body;
    a first ground pin, wherein the pair of first differential signal pins, the pair of second differential signal pins and the first ground pin form a first pin row, and the first ground pin is located between the pair of first differential signal pins and the pair of second differential signal pins;
    a second pin row, wherein the first pin row and the second pin row are parallel to a side edge of the plate body and are disposed on the plate body, and the second pin row is closer to the side edge compared to the first pin row, and the second pin row comprises:
        the pair of third differential signal pins;
        a first power pin; and
    a second ground pin, wherein the pair of third differential signal pins is located between the first power pin and the second ground pin,
    wherein the first pin row is a data transmission/reception pin row supporting the USB 3.0 and the USB 3.0 SSIC transmission specifications, and the USB device control unit further controls the second USB physical layer circuit to perform data transmission through the pair of first differential signal pins and the pair of second differential signal pins.

3. The USB SSIC thin card device as claimed in claim 2, wherein the first pin row is a data transmission/reception pin row supporting the USB 3.0 SSIC transmission specification, the USB SSIC thin card device further comprises a third pin row, parallel to a side edge of the plate body and disposed on the plate body, and the third pin row is closer to the side edge compared to the second pin row,
    wherein the third pin row is a data transmission/reception pin row supporting the USB 3.0 transmission specification, and the third pin row comprises:
        an input/output voltage pin;
        a clock signal pin;
        a core voltage pin;
        a pair of fourth differential signal pins;
        a pair of fifth differential signal pins, wherein the second USB physical layer circuit performs data transmission through the pair of fourth differential signal pins and the pair of fifth differential signal pins; and
        a third ground pin, the pair of fourth differential signal pins is located between the third ground pin and the input/output voltage pin, the pair of fifth differential signal pins is located between the third ground pin and the core voltage pin, the third ground pin is located between the pair of fourth differential signal pins and the pair of fifth differential signal pins, and the clock signal pin and the core voltage pin are respectively located at an outermost position of the third pin row.

4. The USB SSIC thin card device as claimed in claim 2, wherein the second pin row is a data transmission/reception pin row supporting the USB 2.0 transmission specification.

5. A data transfer method of a USB SSIC (SuperSpeed USB Inter-Chip) thin card device, configured to perform data transmission with a host device having a USB (universal serial bus) SSIC circuit, a second USB physical layer circuit and a third USB physical layer circuit, the data transfer method comprising:
- detecting a power voltage supplied to the USB SSIC thin card device;
- determining whether the power voltage is smaller than a predetermined voltage;
- selecting the USB SSIC circuit to perform data transmission with the host device through a pair of first differential signal pins and a pair of second differential signal pins when the power voltage is smaller than the predetermined voltage, wherein the USB SSIC circuit is configured to transmit data complied with a USB 3.0 SSIC transmission specification;
- determining whether the pair of first differential signal pins and the pair of second differential signal pins have signal transmission when the power voltage is not smaller than the predetermined voltage;
- selecting the second USB physical layer circuit to perform data transmission with the host device through the pair of first differential signal pins and the pair of second differential signal pins when the pair of first differential signal pins and the pair of second differential signal pins have the signal transmission; and
- the third USB physical layer circuit performs data transmission with the host device through a pair of third differential signal pins when the pair of first differential signal pins and the pair of second differential signal pins do not have the signal transmission.

6. The data transfer method of the USB SSIC thin card device as claimed in claim 5, wherein the second USB physical layer circuit is configured to transmit data complied with a USB 3.0 transmission specification, and the third USB physical layer circuit is configured to transmit data complied with a USB 2.0 transmission specification.

* * * * *